(12) United States Patent
Hofmann et al.

(10) Patent No.: US 6,838,880 B2
(45) Date of Patent: Jan. 4, 2005

(54) FLOW-THROUGH CRYOGENIC NMR PROBE

(75) Inventors: Martin Hofmann, Rheinstetten (DE);
Manfred Spraul, Ettlingen (DE);
Robert Eric Nast, Saratoga, CA (US);
Damon Leslie Harris, Livermore, CA (US)

(73) Assignee: Bruker Biospin Corporation, Billerica, MA (US)

( * ) Notice: Subject to any disclaimer, the term of this patent is extended or adjusted under 35 U.S.C. 154(b) by 0 days.

(21) Appl. No.: 10/388,369

(22) Filed: Mar. 13, 2003

(65) Prior Publication Data

US 2004/0004478 A1 Jan. 8, 2004

Related U.S. Application Data

(60) Provisional application No. 60/364,559, filed on Mar. 15, 2002.

(51) Int. Cl.[7] ............................................. G01V 3/00
(52) U.S. Cl. ..................................... 324/318; 324/319
(58) Field of Search ................................ 324/318, 319, 324/321, 309, 307

(56) References Cited

U.S. PATENT DOCUMENTS

| | | | | |
|---|---|---|---|---|
| 5,247,256 A | * | 9/1993 | Marek | 324/321 |
| 5,508,613 A | * | 4/1996 | Kotsubo et al. | 324/318 |
| 5,530,353 A | * | 6/1996 | Blanz | 324/315 |
| 5,689,187 A | * | 11/1997 | Marek et al. | 324/318 |
| 6,194,900 B1 | * | 2/2001 | Freeman et al. | 324/321 |
| 6,466,019 B2 | * | 10/2002 | Marek | 324/318 |

FOREIGN PATENT DOCUMENTS

| | | |
|---|---|---|
| EP | 0 453 834 A | 4/1991 |
| GB | 2 253 704 A | 9/1992 |
| WO | WO 97/38325 A1 | 10/1997 |
| WOWO | PCT/IB 03/02430 | 10/2003 |

* cited by examiner

Primary Examiner—Brij B. Shrivastav
(74) Attorney, Agent, or Firm—Kudirka & Jobse, LLP

(57) ABSTRACT

A nuclear magnetic resonance (NMR) spectroscopy probe has a sample cell into and out of which a room temperature liquid sample may be directed. The cell is surrounded by a radio frequency coil that is used to perform NMR measurements of the liquid sample, and which is maintained at cryogenic temperatures. The coil is separated from the sample cell by a thermally insulative boundary, such as a vacuum. The sample may enter the cell through an input path, and may exit through an output path. The input path, output path and sample cell may be surrounded by a sheath through which flows room temperature gas. The ends of the sample cell may be tapered to promote thorough flow through the cell, and flow diverters may be included in the sample cell adjacent to the input and output paths to force flow to the outer wall of the sample cell.

47 Claims, 5 Drawing Sheets

FLOW-THROUGH CRYOGENIC NMR PROBE

CROSS-REFERENCE TO RELATED APPLICATION

This application takes priority from U.S. Provisional Patent Application Ser. No. 60/364,559, filed Mar. 15, 2002.

FIELD OF THE INVENTION

This invention relates generally to the field of nuclear magnetic resonance (NMR) and, more particularly, to NMR using cryogenically-cooled probes.

BACKGROUND OF THE INVENTION

In an NMR spectrometer, a sample is placed in a static magnetic field which causes atomic nuclei within the sample to align in the direction of the field. Transmit and receive coils, which may be combined in a single coil or set of coils, are placed in the probe positioned close to the sample. The transmit coils apply an RF magnetic field orthogonal to the direction of the static magnetic field, perturbing the alignment of the nuclei. The transmit signal is then turned off, and the resonant RF signal of the sample is detected by the receiver coil. The sensitivity of the spectrometer depends on a number of factors, including the strength of the static field, the closeness of the coupling between the RF coils and the sample, and the resistance of the RF coil.

Currently, most commercial NMR spectrometers use RF coils made of a normal metal, such as copper, or a combination of normal metals. Much research has been devoted to the design of coils for maximum sensitivity. For example, to achieve close coupling, coils have been made that include configurations such as solenoids, saddle coils and birdcage coils, all of which have high filling factors. In each case, however, the resistance of these coil materials has limited their sensitivity. Cooling of RF coils has been suggested to reduce their resistance and minimize thermal noise. However, even when cooled, the sensitivity of conventional normal-metal coils is still limited by their resistance. The use of superconductors in place of conventional normal metal for RF coils in NMR spectrometers has also previously been suggested. For example, U.S. Pat. No. 5,247,256 to Marek describes several RF receiver coil arrangements for NMR spectrometers using thin-film superconducting coils.

In certain analytical environments, it is desirable to test numerous samples as part of an overall experiment. It is also useful to allow an analysis system to be linked to other processes in so-called "hyphenated techniques." For example, such a system might link a separation technique, such as liquid chromatography, with an analytical technique, such as NMR. Automation in such systems could allow the automatic processing of all the samples needed for the experiment.

SUMMARY OF THE INVENTION

The invention provides a cryogenically-cooled probe for NMR analysis into and out of which liquid samples may flow. The flow-through probe enables liquid samples to be tested using an RF coil in a cryogenic environment. Obviously, however, although the coil is in a cryogenic environment, the liquid sample is not. The probe structure is such that the coil may be maintained at temperatures as cold as 15° K., while the liquid sample is maintained at room temperature. Because of the flow-through construction of the probe, the sample may be pumped into a sample cell, tested, and pumped out without manual intervention. Thus, the sample cell may reside permanently within the probe, as it is not necessary to remove it to change the sample.

According to the present invention a sample cell in which a liquid sample is located during NMR analysis is maintained at room temperature. Although an RF coil surrounding the sample cell is at cryogenic temperatures, it is located in a vacuum that acts as a thermally insulative layer and minimizes heat transfer capability via convection and conduction. The sample cell may be separated from the vacuum by a sheath. Within the sheath flows a room temperature gas that prevents any significant loss of heat by the fluid through various heat transfer mechanisms. Preferably, fluid is pumped into the sample cell through an inlet capillary, and pumped out of the cell through an outlet capillary, and the room temperature gas travels along a path in which the capillaries are contained. Thus, the warming of the fluid occurs in the capillaries as well as in the sample cell.

In one embodiment, the sample cell is shaped to minimize the presence of dead space within the sample cell that might otherwise result from flow dynamics within the cell. In such a dead space, sample fluid could become trapped while a new sample is being introduced, resulting in cross-contamination between the samples. Thus, the sample cell of the present invention is designed to avoid such dead spaces. One embodiment uses a sample cell with ends that taper toward their respective capillaries. In another embodiment, the sample cell has tapered ends and also has flow diverters adjacent the ends. The flow diverters, that may each be shaped like two cones connected base-to-base, force the fluid flowing in the sample cell toward the sides of the sample cell, and further reduce the possibility of dead space.

The overall probe may have a cylindrical outer casing adjacent to a cylindrical inner casing. The inner casing contains the vacuum space within which the RF coil is located. The RF coil is connected by a thermal conductor to a heat exchanger which might, for example, be fed by cooled helium. The space between the inner casing and the outer casing provides a return path for the sample outlet capillary and the room temperature gas that surrounds it. The inlet capillary may be located with the sheath that follows the longitudinal axis of the probe, leading to the sample cell. The sample cell is preferably mounted to the inside of the sheath by annular spacers having holes to allow the passage of the room temperature gas through the sheath in a longitudinal direction. The probe may include a base, within which are located input and output ports that provide access, respectively, to the inlet and outlet capillaries of the system.

In another embodiment of the present invention, the sheath may be omitted, and an outer wall of the sample cell itself can serve as a vacuum barrier. The outer sample cell wall may have a coating that provides thermal insulation by, for example, blocking thermal radiation from a sample in the sample cell and from the sample cell itself. In another variation, the coating may include an active heating element that is controlled to provide heat to the sample in the sample cell.

In yet another embodiment, the probe may include a reference cell adjacent to the sample cell within which is located a reference material that is also detectable by the RF coil. In one arrangement, the reference cell surrounds the sample cell and is part of a fluid path by which reference fluid may be conducted past the sample cell. This reference fluid may be selected for its particular NMR signal characteristics, and may also be at a temperature that helps prevent heat loss from the sample cell.

BRIEF DESCRIPTION OF THE DRAWINGS

The above and further advantages of the invention may be better understood by referring to the following description in conjunction with the accompanying drawings in which.

DETAILED DESCRIPTION

Figure 1:
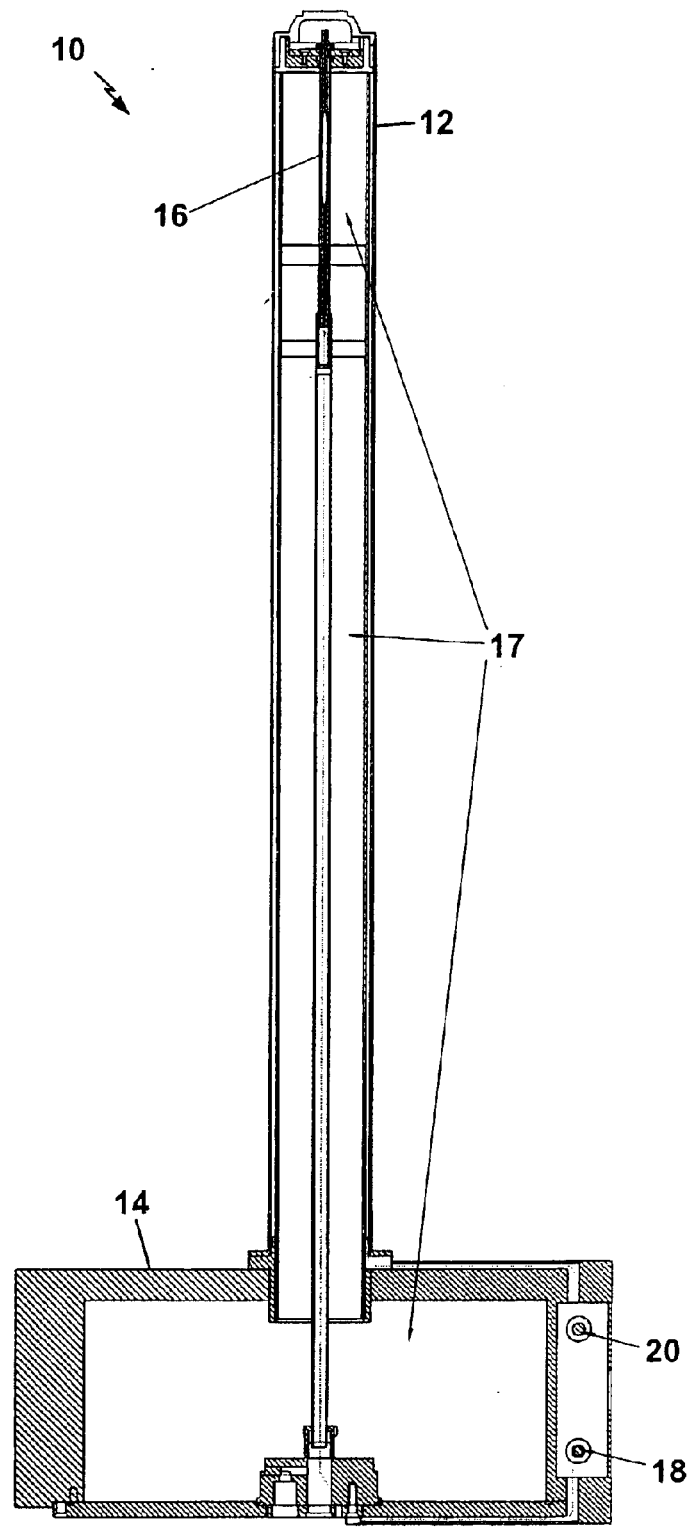
FIG. 1 is a cross-sectional front view of a flow-through cryogenic NMR probe according to the present invention.

Shown in FIG. 1 is a cryogenic flow-through NMR probe 10 according to the present invention. The probe 10 has an outer casing 12 mounted to a base 14. Within the probe is a sample cell 16, which is surrounded by an NMR coil (not shown). The coil resides in one of the evacuated portions 17 of the probe, and is kept at a cold temperature via thermal conduction from a heat exchanger. The sample cell 16 is fed by a capillary that runs along a longitudinal axis of the probe, providing a flow of liquid sample solution to the sample cell from an inlet port 18. A similar capillary tube functions as a return, running from the top of the sample cell along the outer casing 12 to the base 14, and finally out outlet port 20.

Figure 2:
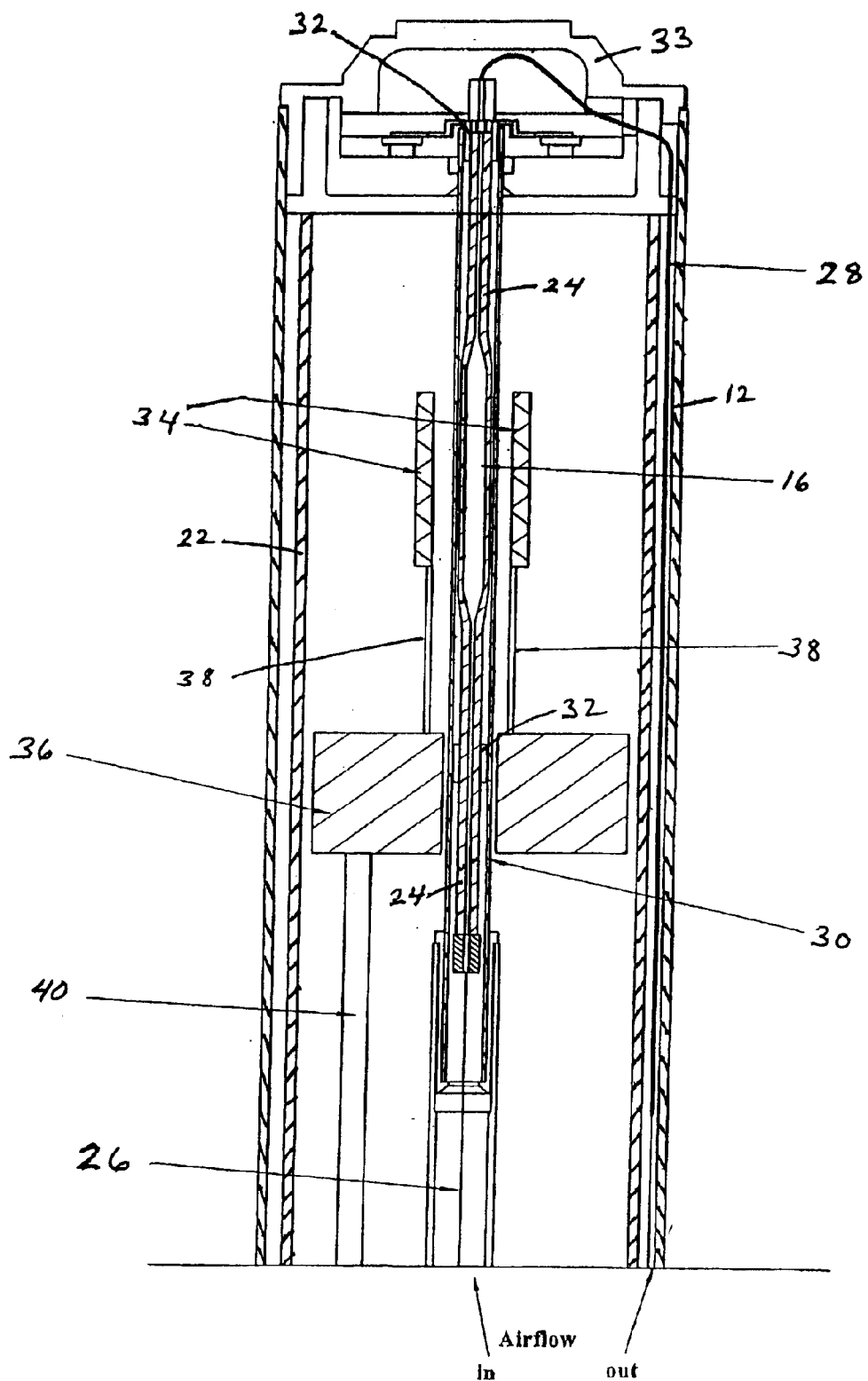
FIG. 2 is a more detailed cross-sectional front view of a portion of the probe shown in FIG. 1.

The sample region of the probe is shown in more detail in FIG. 2. The outer casing 12, preferably cylindrical, may be constructed from a non-magnetic metal. Also constructed from a similar material is an inner casing 22. The inner casing is preferably also cylindrical, and separated from the outer casing 12 by an annular space. As discussed in more detail below, this space provides a route through which a return flow path from the sample cell may pass.

The sample cell 16 itself is located along the central axis of the probe, and is integral with the flow path extensions 24 extending above and below the sample cell 16. These portions, in turn, connect respectively to capillary inlet tube 26 and capillary outlet tube 28. In this embodiment, the sample cell 16 and flow path extensions 24 are surrounded by sheath 30 which may be, for example, a quartz tube. The sheath is preferably coaxial with the sample cell 16, and maintains a fixed position relative to the sample cell via spacers 32 that maintain contact between the sheath 30 and the extensions 24.

Surrounding the sample cell 16 and the adjacent portion of sheath 30 is RF coil 34. The RF coil may be a conventional metal coil, or may be a superconducting coil having one or more coil portions. The space surrounding the coil 34 is a vacuum so as to minimize thermal conduction between the RF coil 34 and the surrounding space. The coil 34 is kept at cryogenic temperatures via thermal conduction with a heat exchanger 36. Such heat exchangers are known in the prior art and heat exchanger 36 will therefore not be described in any further detail herein. Thermal conductors 38 provide the path for thermal conduction between the heat exchanger 36 and the coil 34. Typically, a cryogen, such as cooled helium gas, would be provided to the heat exchanger such as by gas line 40. Coil temperatures in the range of 15° K. are desirable.

Despite the cold temperatures of the coil, it is desirable to keep the sample temperature much higher to prevent its freezing. In one embodiment of the present invention, the sample is maintained at approximately room temperature by feeding a flow of warm gas through the space within sheath 30. The thermal transfer between the sample cell 16 and the coil 34 is minimized by the presence of the vacuum in the space surrounding the coil, and other thermal transfer mechanisms are effectively countered using the warm gas flow. The space within the sheath and the space between the inner casing 22 and the outer casing 12 together form a fluid circuit through which the warm gas may flow. Cap 33 seals the top of the probe, to ensure the fluid circuit between the sheath 30 and the space between the inner and outer casings. In FIG. 2, the inward and outward airflow directions are indicated near the bottom of the figure. In order to allow gas flow, the spacers 32 have some airflow passages through them. For example, the spacers 32 may be annular, each with a plurality of holes that run through the spacer parallel to the longitudinal axis of the flow path.

With the arrangement described above, the coil may be maintained at cryogenic temperatures, while a room-temperature liquid sample is pumped into and out of the sample cell 16. The sample, typically a material of interest in a solvent solution, travels into the probe via inlet capillary 26. An external flow-generating mechanism, such as a pump, is used to move the sample into the sample cell 16. The pumping continues until the new sample fills the sample cell 16, and the NMR analysis is then conducted. Once the desired data is gathered, the pump is once again activated to move the sample out of the sample cell and to the system outlet port via outlet capillary 28. The system could also be operated in an "on-flow" mode in which the sample flows continuously for a certain period of time during which multiple NMR measurements are made.

Preferably, a new sample, such as a "peak" eluted from a liquid chromatography column, is loaded into the sample cell 16 while the previous one is being removed. Because one sample can closely follow another, it is important to make sure that the remnants of a previous system are completely flushed out of the sample cell 16. Otherwise, the peaks become mixed with pure solvent (and thus diluted) or even with other peaks. It is therefore important to avoid "dead" spaces within the sample cell which might otherwise prevent proper flushing of sample fluid out of the cell. Thus, sample cell shapes that would create corners or other regions outside of the primary flow path of the fluid are avoided. In FIG. 2, the sample cell is tapered from the maximum diameter in the middle to the narrow ends at which it connects, respectively, to the inlet and outlet capillaries. Notably, the tapers are outside of the main field region of the RF coil 34 so as not to contribute to the inhomogeneities of the system.

Figure 3:
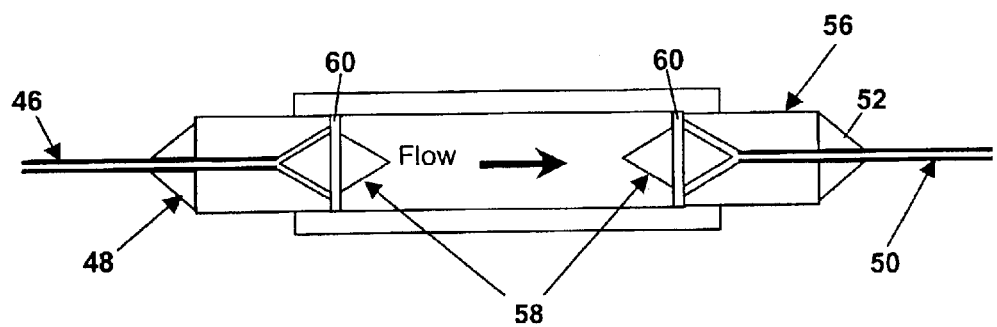
FIG. 3 is a cross-sectional front view of an alternative sample cell for use with a probe such as that of FIG. 1.

Shown in FIG. 3 is a sample cell design that is particularly effective for avoiding the problem of dead space. A fluid sample enters through input capillary 46, which is maintained in position via a retainer such as glue 48. Similarly, outlet capillary 50, through which the fluid sample flows out of the sample cell, may be held in place by retainer 52. As in the embodiment above, the sample cell itself is tapered at the ends, providing a gradual change in diameter from the main portion of the cell to the respective capillaries at the two ends. These tapered regions may be part of connectors 54, 56, which provide connection between the input and output capillaries, respectively, and a cylindrical main body of the sample cell.

The sample cell of FIG. 3 also includes stream diverters 58, which force the flow of the sample fluid toward the sides of the sample cell, thereby minimizing the possibility of "dead space" pockets forming within the sample cell. In the embodiment shown, the diverters are each shaped like a pair of cones connected base-to-base, although those skilled in the art will understand that other shapes may also be used and may provide a similar effect. The diverters are each maintained in a particular position within the sample cell via a spacer 60, which is preferably annular with a number of holes parallel to the longitudinal direction of fluid flow. The spacers keep the diverters in place adjacent to the conical openings of the connectors 54, 56, so that inlet and outlet flow regions are formed in the sample cell.

Figure 4:
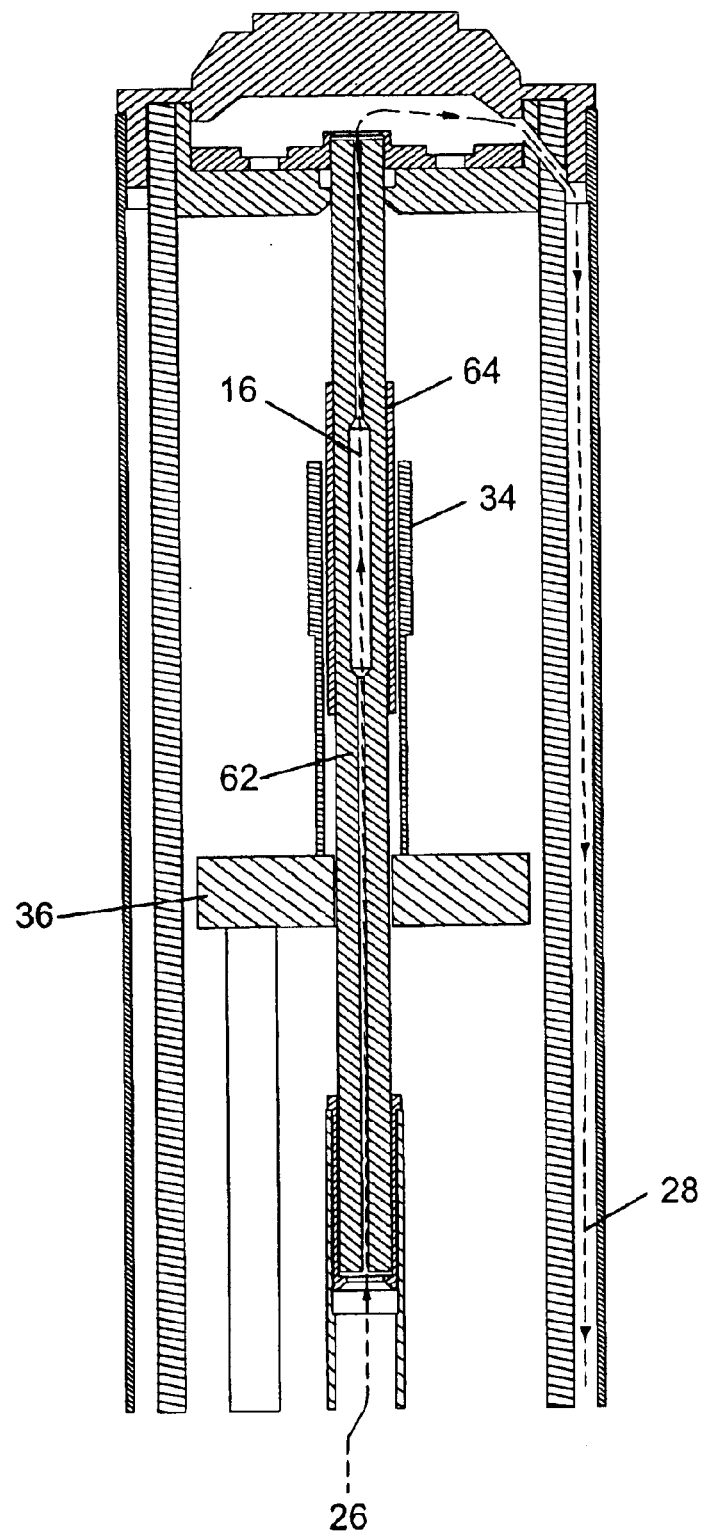
FIG. 4 is a cross-sectional front view of a section of a probe according to the present invention in which the sample cell wall is also a vacuum barrier.

Shown in FIG. 4 is an embodiment of the invention in which a wall surrounding the sample cell 16 is also the wall exposed to the vacuum in the surrounding region of the probe. Rather than having a separate sheath as a vacuum barrier, the wall 62 serves both to contain the sample and to separate it from the evacuated region. As shown, the wall may therefore be thick so as to resist the pressure stresses and maintain good thermal isolation since, in this embodiment, there is no path for a heated gas to flow around the sample cell. However, the single wall may still take up less space than the sample cell and sheath combination of FIG. 2, thus allowing the RF coil to be placed closer to the sample cell so as to improve the filling factor and the signal-to-noise ratio. Optionally, a coating 64 may be applied to the wall 62 to help prevent heat loss from the sample. The coating may be a passive layer that insulates the sample cell and helps block thermal radiation. Such a passive coating could be, for example, a metal such as silver, gold or aluminum that is patterned to make it transparent to RF radiation. In another variation, the coating could be an active heating element, such as an electrical heater that is bonded to the sample cell surface. The heater could be installed in such a way that RF current induced in the heater circuit, and consequent loading of the RF coils, is minimized. An example would be to use electrically resistive heater wires or tapes with series inductors or RF "traps." In FIG. 4, the fluid input path 26 and output path 28 are shown as dashed lines, although though skilled in the art will recognize that these are actually solid components, such as capillaries.

Figure 5:
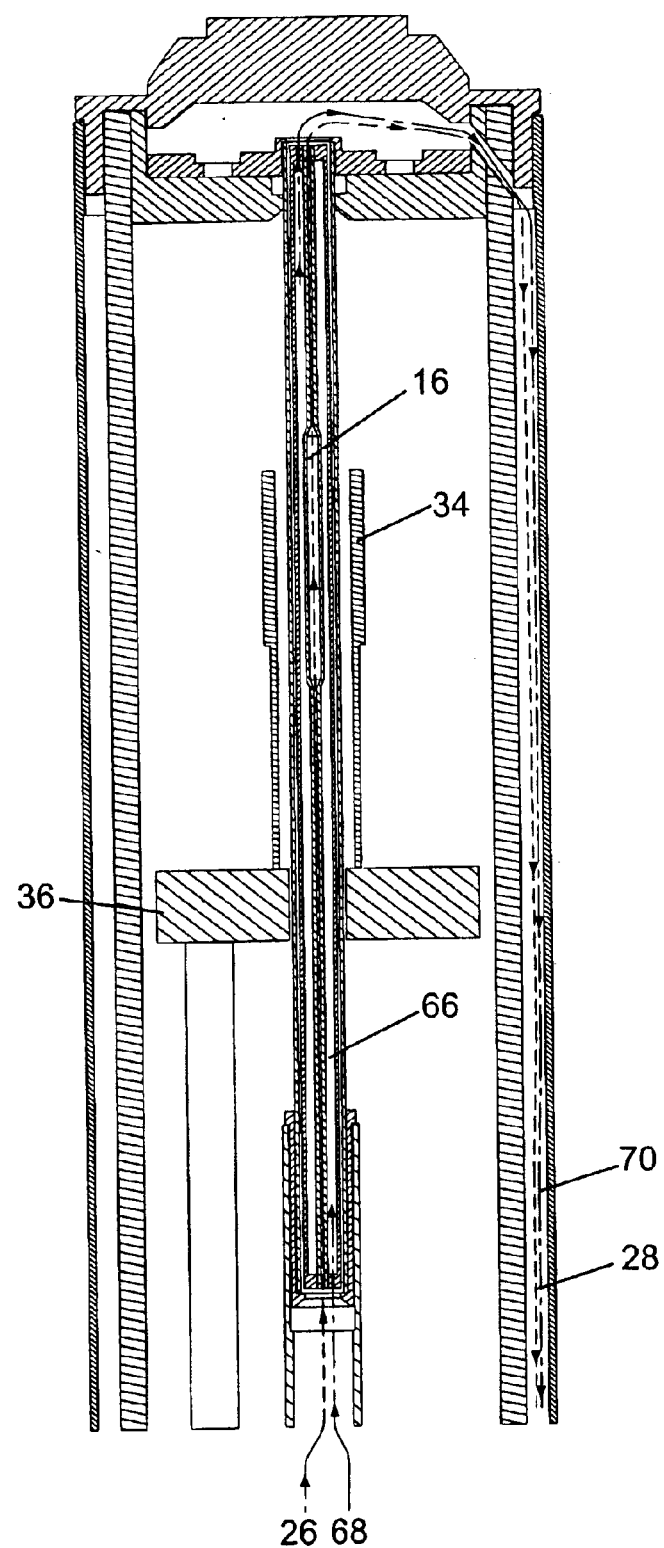
FIG. 5 is a cross-sectional front view of a section of a probe according to the present invention in which a reference fluid path surrounds the sample cell.

Another embodiment of the invention is shown in FIG. 5 in which two fluid passages are provided through the probe. The passage for the sample fluid is essentially the same as is described above for the embodiment of FIG. 2, entering through sample input path 26, passing through sample cell 16 and exiting through sample exit path 28. Unlike the FIG. 2 embodiment, however, the probe of FIG. 6 includes a second fluid pathway that surrounds much of the sample fluid path and the sample cell 16. This outer fluid path can serve either or both of two functions. First, the fluid that passes through outer fluid path may be at room temperature, or warmer, to help keep the sample fluid at room temperature. The fluid may also serve as a reference material during NMR measurement. That is, the fluid could be a material with a known NMR characteristic that could be used to calibrate the probe, or to provide an NMR signal that can be viewed in comparison to the signal produced by the sample fluid. Most likely, the fluid is a deuterated solvent to provide a "field-frequency lock" to stabilize the DC magnetic field, as is known in the art.

The embodiment of FIG. 5 has two separately controllable flow paths. As mentioned above, the sample fluid flows through input sample path 26, into sample cell 16 and out through sample output path 28. Fluid in the outer fluid path 66 enters through a reference fluid input path 68, travels around and past the sample cell 16 and exits through a reference fluid output path 70. These paths are shown as dashed lines for clarity, but are actually separate input channels, such as capillaries. Although not necessary, the reference fluid input path 68 connects to an opposite side of the reference fluid path 66 from output path 70. This may promote mixing of the reference fluid as it passes through the reference fluid path 66. Examples of a reference fluid might be a system field-frequency locking fluid such as acetone-D6, carbon deuterium trichloride ($CDCl_3$) or heavy water ($D_2O$). The particular choice of a reference fluid may depend on the particular type of NMR experiment being conducted, and those skilled in the art will recognize the possibility of using other reference fluids as well.

While the invention has been shown and described with reference to a preferred embodiment thereof, those skilled in the art will recognize that various changes in form and detail may be made herein without departing from the spirit and scope of the invention as defined by the appended claims.

What is claimed is:

1. A cryogenically cooled probe apparatus for nuclear magnetic resonance spectroscopy, the apparatus comprising:
   a sample cell for containing a liquid sample, the sample cell allowing flow of the liquid sample into and out of the cell; and
   a radio frequency (RF) coil surrounding the sample cell, the coil being maintained at cryogenic temperatures and being separated from the sample by a thermally insulating boundary.

2. An apparatus according to claim 1 wherein the insulative boundary between the coil and the sample cell comprises a vacuum.

3. An apparatus according to claim 1 wherein the insulative boundary is such that the temperature of the liquid sample, while in the sample cell, remains at approximately an ambient temperature surrounding the apparatus.

4. An apparatus according to claim 1 further comprising a heat exchanger thermally coupled to the coil that maintains the coil at cryogenic temperatures.

5. An apparatus according to claim 1 further comprising an input path through which the liquid sample is directed to the sample cell and an output path through which the liquid sample may be removed from the cell.

6. An apparatus according to claim 5 wherein the sample cell is tapered outward adjacent to the input and output paths.

7. An apparatus according to claim 6 further comprising at least one flow diverter in at least one tapered portion of the sample cell that forces flow of fluid toward an outer wall of the sample cell adjacent to the flow diverter.

8. An apparatus according to claim 5 further comprising a sheath surrounding the input and output paths and the sample cell, within which may be contained a material that helps maintain the sample flowing through the paths at a relatively high temperature relative to the coil.

9. An apparatus according to claim 8 wherein the relatively high temperature is approximately equal to an ambient temperature surrounding the apparatus.

10. An apparatus according to claim 8 wherein the material contained in the sheath flows from an input port to an output port.

11. An apparatus according to claim 10 wherein the material is a gas approximately equal in temperature to an ambient temperature surrounding the apparatus, and wherein the gas flows through the sheath while the liquid sample is in the sample cell.

12. An apparatus according to claim 11 wherein the input and output paths include a path through an outer casing surrounding the apparatus.

13. An apparatus according to claim 8 wherein an outer wall of the sheath separates the sample cell from a vacuum that functions, at least in part, as said insulative boundary.

14. An apparatus according to claim 1 wherein the coil is maintained at a temperature of less than 40° K.

15. An apparatus according to claim 1 wherein the sample cell resides permanently within a probe housing.

16. An apparatus according to claim 1 wherein an outer wall of the sample cell separates the sample from a vacuum that functions, at least in part, as said insulative boundary.

17. An apparatus according to claim 16 further comprising a coating on an outer surface of the sample cell outer wall, the coating providing thermal insulation to the sample cell.

18. An apparatus according to claim 17 wherein the coating blocks thermal radiation from the sample cell.

19. An apparatus according to claim 17 wherein the coating comprises an active heating element.

20. An apparatus according to claim 1 further comprising a reference cell that resides adjacent to the sample cell, a reference material in the reference cell also being detectable by the RF coil.

21. An apparatus according to claim 20 wherein the reference cell surrounds the sample cell.

22. An apparatus according to claim 21 wherein the reference cell comprises a fluid path for a reference fluid that flows past an outer wall of the sample cell.

23. An apparatus according to claim 21 wherein the reference fluid provides a thermal boundary that prevents heat loss from the sample cell.

24. A cryogenically cooled probe apparatus for nuclear magnetic resonance spectroscopy, the apparatus comprising:
   a sample cell for containing a liquid sample at a temperature approximately equal to an ambient temperature surrounding the apparatus, the sample cell residing permanently within a probe housing and allowing flow of the liquid sample into and out of the cell;
   a radio frequency (RE) coil surrounding the sample cell, the coil being maintained at cryogenic temperatures and being separated from the sample by a vacuum; and
   a heat source between the sample cell and the RF coil that limits heat loss from the sample in the sample cell.

25. A method of providing a nuclear magnetic resonance spectroscopic measurement of a liquid sample, the method comprising:
   providing a sample cell for containing a liquid sample, the sample cell allowing flow of the liquid sample into and out of the cell;
   surrounding the sample cell with a radio frequency (RF) coil that is maintained at cryogenic temperatures and kept thermally separated from the sample cell by a thermally insulating boundary;
   directing flow of the sample into the sample cell and activating the coil to perform the desired measurement; and
   directing flow of the sample out of the sample cell.

26. A method according to claim 25 wherein the insulative boundary between the coil and the sample cell comprises a vacuum.

27. A method according to claim 25 wherein the insulative boundary is such that the temperature of the liquid sample, while in the sample cell, remains at approximately an ambient temperature surrounding the apparatus.

28. A method according to claim 25 further comprising thermally coupling a heat exchanger to the coil and operating it to maintain the coil at cryogenic temperatures.

29. A method according to claim 25 wherein directing flow of the sample into the sample cell comprises directing flow through an input path and directing flow of the sample out of the sample cell comprises directing flow through an output path.

30. A method according to claim 29 wherein providing a sample cell comprises providing a sample cell that is tapered outward adjacent to the input and output paths.

31. A method according to claim 30 further comprising diverting flow in the sample cell using at least one flow diverter located in at least one tapered portion of the sample cell, the flow diverting forcing flow of fluid toward an outer wall of the sample cell adjacent to the flow diverter.

32. A method according to claim 29 further comprising surrounding the input and output paths and the sample cell with a sheath within which may be contained a material that helps maintain the sample flowing through the paths at a relatively high temperature relative to the coil.

33. A method according to claim 32 wherein the relatively high temperature is approximately equal to an ambient temperature surrounding the apparatus.

34. A method according to claim 32 wherein the material contained in the sheath flows from an input port to an output port.

35. A method according to claim 33 wherein the material is a gas approximately equal in temperature to an ambient temperature surrounding the apparatus, and further comprising directing flow of the gas through the sheath while the liquid sample is in the sample cell.

36. A method according to claim 35 wherein the input and output paths for the sample liquid include a path through an outer casing surrounding the apparatus.

37. A method according to claim 32 wherein an outer wall of the sheath separates the sample cell from a vacuum that functions, at least in part, as said insulative boundary.

38. A method according to claim 25 further comprising maintaining the coil at a temperature of less than 40° K.

39. A method according to claim 25 wherein the sample cell resides permanently within a probe housing.

40. A method according to claim 25 wherein an outer wall of the sample cell separates the sample from a vacuum that functions, at least in part, as said insulative boundary.

41. A method according to claim 40 further comprising locating a coating on an outer surface of the sample cell outer wall, the coating providing thermal insulation to the sample cell.

42. A method according to claim 41 wherein the coating blocks thermal radiation from the sample cell.

43. A method according to claim 41 wherein the coating comprises an active heating element.

44. A method according to claim 25 further comprising locating a reference cell that resides adjacent to the sample cell, a reference material in the reference cell also being detectable by the RF coil.

45. A method according to claim 44 wherein the reference cell surrounds the sample cell.

46. A method according to claim 45 wherein the reference cell comprises a fluid path for a reference fluid that flows past an outer wall of the sample cell.

47. A method according to claim 46 wherein the reference fluid provides a thermal boundary that prevents heat loss from the sample cell.

* * * * *